US010103707B2

United States Patent
Lin et al.

(10) Patent No.: US 10,103,707 B2
(45) Date of Patent: Oct. 16, 2018

(54) POWER AMPLIFYING CONVERTER

(71) Applicant: National Chi Nan University, Nantou County (TW)

(72) Inventors: Yo-Sheng Lin, Taichung (TW); Ynn-Wen Lin, Taichung (TW); Ming-Huang Kao, Nantou County (TW)

(73) Assignee: NATIONAL CHI NAN UNIVERSITY, Nantou County (TW)

( * ) Notice: Subject to any disclaimer, the term of this patent is extended or adjusted under 35 U.S.C. 154(b) by 0 days.

(21) Appl. No.: 15/359,051

(22) Filed: Nov. 22, 2016

(65) Prior Publication Data

US 2018/0083590 A1 Mar. 22, 2018

(30) Foreign Application Priority Data

Sep. 20, 2016 (TW) .............................. 105130291 A

(51) Int. Cl.
| | |
|---|---|
| *H01P 5/12* | (2006.01) |
| *H03H 7/42* | (2006.01) |
| *H03F 3/60* | (2006.01) |
| *H01P 5/10* | (2006.01) |

(52) U.S. Cl.
CPC ................ *H03H 7/42* (2013.01); *H01P 5/10* (2013.01); *H03F 3/602* (2013.01); *H01P 5/12* (2013.01); *H03F 2200/198* (2013.01); *H03F 2200/451* (2013.01)

(58) Field of Classification Search
CPC .................................. H03H 7/42; H03F 3/602
USPC ................................................... 333/125–129
See application file for complete search history.

(56) References Cited

U.S. PATENT DOCUMENTS

| | | | |
|---|---|---|---|
| 6,441,696 B1 | 8/2002 | Westberg | |
| 8,290,453 B2* | 10/2012 | Yoshihara | ................ H01P 5/10 330/124 R |
| 2003/0156003 A1* | 8/2003 | Sortor | .................... H01F 19/04 336/200 |
| 2006/0001502 A1* | 1/2006 | Tabatchnick | ............. H01P 5/10 333/26 |

* cited by examiner

*Primary Examiner* — Robert J Pascal
*Assistant Examiner* — Kimberly Glenn
(74) *Attorney, Agent, or Firm* — Muncy, Geissler, Olds & Lowe, P.C.

(57) ABSTRACT

A power amplifying converter comprises a multi-balanced-unbalanced converting unit, a plurality of power amplifying units, a plurality of dual-path power combining units and a differential power combining unit. The multi-balanced-unbalanced converting unit is provided with a first input/output end and a plurality of second input/output ends. Each of the power amplifying units is provided with a first input end electrically connected to the second input/output end, and a first output end. Each of the dual-path power combining units is provided with two second input ends electrically connected to the first output ends, and a second output end. The differential power combining unit is provided with two third input ends electrically connected to the second output ends, and a third output end. In this case, the multi-balanced-unbalanced converting unit is made up of a plurality of $\frac{1}{12}$ wavelength transmission lines.

6 Claims, 9 Drawing Sheets

POWER AMPLIFYING CONVERTER

FIELD OF THE INVENTION

The present invention is related to a power amplifying converter, particularly to a power amplifying converter with a balanced-unbalanced converting unit made up of 1/12 wavelength transmission lines.

BACKGROUND OF THE INVENTION

In the field of wireless transmission, types of signal transmission are primarily classified into balanced transmission and unbalanced transmission. Each type of signal transmission, however, has its own advantages and disadvantages. To solve the above problems, two types of signal transmission are further integrated by wireless communication industries to form a device having functions of balanced transmission and unbalanced transmission at the same time, such that respective disadvantages are remedied. This device is mostly made up of ¼ wavelength transmission lines.

For instance, U.S. Pat. No. 6,441,696 B1 proposed a balun circuit comprising a λ/2 waveguide, a first λ/4 waveguide and a biasing means. A first end of the λ/2 waveguide is connected to a first port of the balun circuit, and a second end of the λ/2 waveguide is then connected to a second port of the balun circuit. A first end of the first λ/4 waveguide is connected to the second end of the λ/2 waveguide, while a second end of the first λ/4 waveguide is connected to a third port of the balun circuit. The biasing means is used for biasing components in a load connected between the first and second ports of the balun circuit. The biasing means comprises a second λ/4 waveguide, a first end of the second λ/4 waveguide being connected to the first end of the λ/2 waveguide, a second end of the second λ/4 waveguide being connected to a voltage source and to one electrode of a second capacitor, the other electrode of the second capacitor being connected to ground.

In the above prior art, the balun circuit is made up of ½ wavelength and ¼ wavelength waveguides. When it is necessary for the circuit to be provided in the manner of multi-balanced-unbalanced conversion, the overall area of circuit is grown by multiple times, and further, the available area is then limited. In addition, the required area of circuit is increased, and length of transmission line is also increased correspondingly. In this connection, higher loss of transmission is resulted, and overall characteristics of the converter are then reduced significantly.

SUMMARY OF THE INVENTION

It is the main object of the present invention to solve the problems of an excessively large area of overall circuit and poor characteristics of the conventional balun circuit.

For achieving the above object, the present invention provides a power amplifying converter comprising a multi-balanced-unbalanced converting unit, a plurality of power amplifying units, a plurality of dual-path power combining units and a differential power combining unit. The multi-balanced-unbalanced converting unit is provided with a first input/output end and a plurality of second input/output ends. Each of the power amplifying units is provided with a first input end and a first output end. The first input end is electrically connected to the second input/output end. Each of the dual-path power combining units is provided with two second input ends and a second output end. The second input end is electrically connected to the first output end. The differential power combining unit is provided with two third input ends and a third output end. The third input end is electrically connected to the second output end. In this case, the multi-balanced-unbalanced converting unit is made up of a plurality of 1/12 wavelength transmission lines.

It is known from the above that, in comparison with the prior art, the effects to be achieved by the present invention are as follows. The multi-balanced-unbalanced converting unit is made up of 1/12 wavelength transmission lines, each of which is one-third as long as the conventional ¼ wavelength transmission line, such that the overall area of circuit is reduced significantly. Moreover, shorter transmission lines are required, so as to achieve lower transmission loss, and further, enhanced overall characteristics. In addition, multi-balanced-unbalanced conversion may be adopted due to increased available space, in such a way that maximum power output is obtained.

DETAILED DESCRIPTION OF THE PREFERRED EMBODIMENTS

The detailed description and technical solution with respect to the present invention will be now described in conjunction with the drawings as follows.

Figure 1:
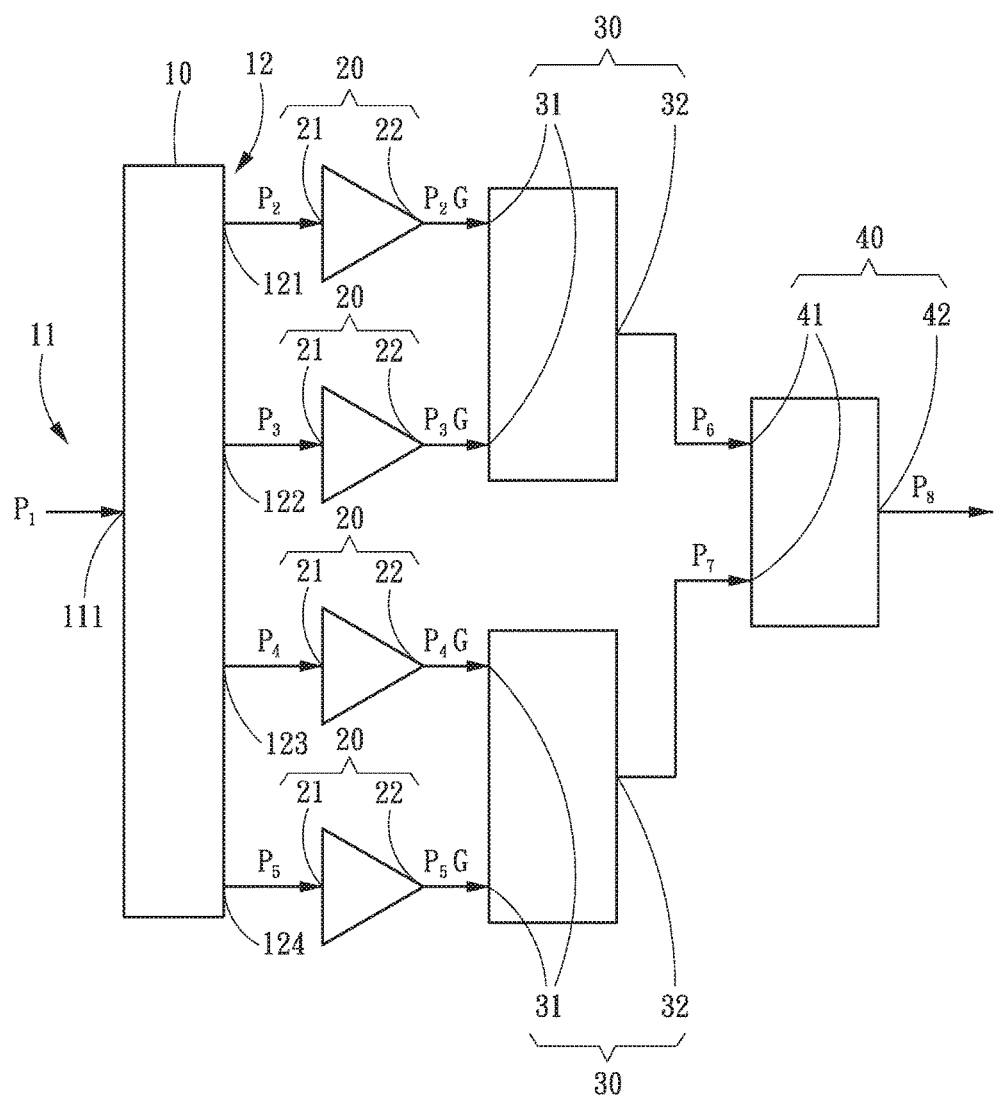
FIG. 1 is a structural diagram of a power amplifying converter of one embodiment of the present invention.

Referring to FIG. 1 together, there is shown a structural diagram of a power amplifying converter in one embodiment of the present invention. The present invention is related to a power amplifying converter comprising a multi-balanced-unbalanced converting unit 10, a plurality of power amplifying units 20, a plurality of dual-path power combining units 30 and a differential power combining unit 40. The multi-balanced-unbalanced converting unit 10 is provided with a first input/output end 11 and a plurality of second input/output ends 12. In the present invention, the multi-balanced-unbalanced converting unit 10 is formed by combining a plurality of ⅟₁₂ wavelength transmission lines. The first input/output end 11 further comprises a first transmission end 111. The second input/output end 12 further comprises a second transmission end 121, a third transmission end 122, a fourth transmission end 123 and a fifth transmission end 124. Each of the power amplifying units 20 is provided with a first input end 21 and a first output end 22, respectively. The first input end 21 is electrically connected to the transmission end of the second input/output end 12. Each of the dual-path power combining units 30 is provided with two second input ends 31 and a second output end 32, respectively. The second input end 31 is electrically connected to the first output end 22. The differential power combining unit 40 is provided with two third input ends 41 and a third output end 42. The third input end 41 is electrically connected to the second output end 32. In the present embodiment, the number of power amplifying units 20 is four, while the number of dual-path power combining units 30 is two.

Figure 2A:
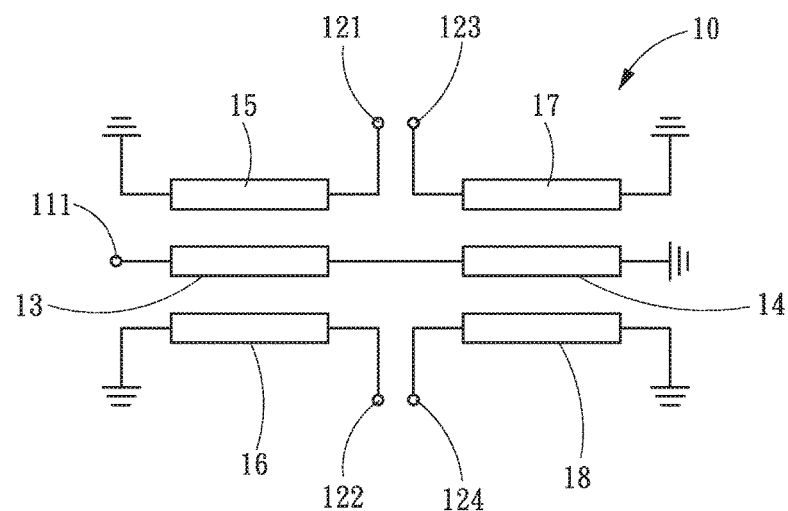
FIG. 2A is a diagram of a multi-balanced-unbalanced converting unit of a first embodiment of the present invention.

In the first embodiment of the present invention, as illustrated in FIG. 2A, the multi-balanced-unbalanced converting unit 10 comprises a first transmission line 13, a second transmission line 14, a third transmission line 15, a fourth transmission line 16, a fifth transmission line 17 and a sixth transmission line 18. The first transmission line 13 and the second transmission line 14 are provided adjacent to each other. The first transmission line 13 is electrically connected at one end thereof to the first transmission end 111, while the first transmission line 13 is electrically connected at the other end thereof to one end of the second transmission line 14. The second transmission line 14 is electrically connected at the other end thereof to one grounding end. The third transmission line 15 and the fourth transmission line 16 are horizontally provided at top and bottom sides of the first transmission line 13, respectively. The third transmission line 15 is electrically connected at two ends thereof to the second transmission end 121 and the grounding end, respectively, while the fourth transmission line 16 is electrically connected at two ends thereof to the third transmission end 122 and the grounding end, respectively. The fifth transmission line 17 and the sixth transmission line 18 are horizontally provided at top and bottom sides of the second transmission line 14, respectively. The fifth transmission line 17 is electrically connected at two ends thereof to the fourth transmission end 123 and the grounding end, respectively, while the sixth transmission line 18 is electrically connected at two ends thereof to the fifth transmission end 124 and the grounding end, respectively.

Figure 2B:
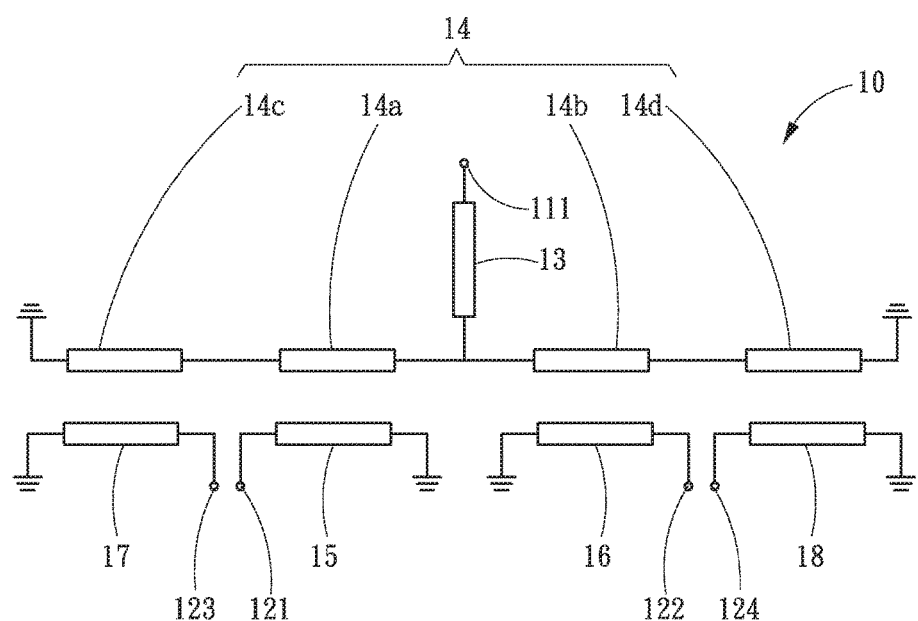
FIG. 2B is a diagram of a multi-balanced-unbalanced converting unit of a second embodiment of the present invention.

In the second embodiment of the present invention, as illustrated in FIG. 2B, the multi-balanced-unbalanced converting unit 10 comprises a first transmission line 13, a second transmission line 14, a third transmission line 15, a fourth transmission line 16, a fifth transmission line 17 and a sixth transmission line 18. The difference between this embodiment and the first embodiment is that the second transmission line 14 further comprises a first branch transmission line 14a, a second branch transmission line 14b, a third branch transmission line 14c and a fourth branch transmission line 14d. The first transmission line 13 is electrically connected at one end thereof to the first transmission end 111, while the first transmission line 13 is electrically connected at the other end thereof to one end of the first branch transmission line 14a and one end of the second branch transmission line 14b. The other end of the first branch transmission line 14a and the other end of the second branch transmission line 14b are electrically connected to one end of the third branch transmission line 14c and one end of the fourth branch transmission line 14d, respectively. The other end of the third branch transmission line 14c and the other end of the fourth branch transmission line 14d are electrically connected to a grounding end, respectively. The third transmission line 15, the fourth transmission line 16, the fifth transmission line 17 and the sixth transmission line 18 are provided horizontally with respect to the first branch transmission line 14a, the second branch transmission line 14b, the third branch transmission line 14c and the fourth branch transmission line 14d. The third transmission line 15 is electrically connected at two ends thereof to the second transmission end 121 and the grounding end, respectively. The fourth transmission line 16 is electrically connected at two ends thereof to the third transmission end 122 and the grounding end, respectively. The fifth transmission line 17 is electrically connected at two ends thereof to the fourth transmission end 123 and the grounding end, respectively. The sixth transmission line 18 is electrically connected at two ends thereof to the fifth transmission end 124 and the grounding end, respectively.

In the practical application, coiling in a manner of planar spiral is adopted in the present invention for the miniaturization of area of each of the transmission lines formed on a substrate. Taking the aforementioned second embodiment for example, referring to FIG. 3, the multi-balanced-unbalanced converting unit 10 comprises a first transmission line 13, a second transmission line 14, a third transmission line 15, a fourth transmission line 16, a fifth transmission line 17, a sixth transmission line 18 and a connecting part 19. The first transmission line 13 comprises a first strip-type transmission line 131 situated at a central region. The detailed structure of this first strip-type transmission line will be described as follows. Referring to FIG. 4A, which is a partially enlarged diagram of left half of FIG. 3, together, the first transmission line 13 comprises a second strip-type transmission line 132, a first L-type transmission line 133 and a second L-type transmission line 134. The second strip-type transmission line 132 is extended from one end of the first strip-type transmission line 131 in the direction far away from the central region. The first L-type transmission line 133 is extended from the end of extension of the second strip-type transmission line 132 in the direction far away from the central region. The second L-type transmission line 134 is extended from the end of extension of the first L-type transmission line 133 in the direction toward the central region. The first L-type transmission line 133 comprises a first wide type transmission line 133a provided in the direction perpendicular to the second strip-type transmission line 132, and a second wide type transmission line 133b provided in the direction perpendicular to the first wide type transmission line 133a. The second L-type transmission line 134 comprises a third wide type transmission line 134a provided in the direction perpendicular to the second wide type transmission line 133b, and a fourth wide type transmission line 134b provided in the direction perpendicular to the third wide type transmission line 134a. The connecting part 19 comprises a third strip-type transmission line 191, the third strip-type transmission line 191 being laterally extended from the end of extension of the second L-type transmission line 134 in the direction far away from the central region.

The second transmission line 14 is provided adjacent to the first transmission line 13, and comprises a third L-type transmission line 141, a fourth L-type transmission line 142 and a fifth L-type transmission line 143. The third L-type transmission line 141 is extended from the end of extension of the third strip-type transmission line 191 in the direction far away from the central region. The fourth L-type transmission line 142 is extended from the end of extension of the third L-type transmission line 141 in the direction toward the central region. The fifth L-type transmission line 143 is extended from the end of extension of the fourth L-type transmission line 142 in the direction far away from the central region. The third L-type transmission line 141 comprises a fifth wide type transmission line 141a provided in the direction perpendicular to the first strip-type transmission line 131, and a sixth wide type transmission line 141b provided in the direction perpendicular to the fifth wide type transmission line 141a. The fourth L-type transmission line 142 comprises a seventh wide type transmission line 142a provided in the direction perpendicular to the sixth wide type transmission line 141b, and an eighth wide type transmission line 142b provided in the direction perpendicular to the seventh wide type transmission line 142a. The fifth L-type transmission line 143 comprises a ninth wide type transmission line 143a provided in the direction perpendicular to the eighth wide type transmission line 142b, and a tenth wide type transmission line 143b provided in the direction perpendicular to the ninth wide type transmission line 143a. The tenth wide type transmission line 143b is extended in the direction far away from the third L-type transmission line 141.

The third transmission line 15 is provided adjacent to the first transmission line 13, and comprises a fourth strip-type transmission line 151, a first microstrip-type transmission line 152, a first micro L-type transmission line 153 and a second micro L-type transmission line 154. The fourth strip-type transmission line 151 is provided at one side of the second wide type transmission line 133b of the first L-type transmission line 133. The first microstrip-type transmission line 152 is extended from one end of the fourth strip-type transmission line 151 in the direction far away from the central region. The first micro L-type transmission line 153 is extended from the end of extension of the first microstrip-type transmission line 152 in the direction toward the central region. The second micro L-type transmission line 154 is extended from the end of extension of the first micro L-type transmission line 153 in the direction far away from the central region. The first micro L-type transmission line 153 comprises a first thin type transmission line 153a provided in the direction perpendicular to the first microstrip-type transmission line 152, and a second thin type transmission line 153b provided in the direction perpendicular to the first thin type transmission line 153a. The second micro L-type transmission line 154 comprises a third thin type transmission line 154a provided in the direction perpendicular to the second thin type transmission line 153b, and a fourth thin type transmission line 154b provided in the direction perpendicular to the third thin type transmission line 154a.

The fifth transmission line 17 is provided adjacent to the second transmission line 14, and comprises a fifth strip-type transmission line 171, a second microstrip-type transmission line 172, a third micro L-type transmission line 173 and a fourth micro L-type transmission line 174. The fifth strip-type transmission line 171 is provided at one side of the seventh wide type transmission line 142a of the fourth L-type transmission line 142. The second microstrip-type transmission line 172 is extended from one end of the fifth strip-type transmission line 171 in the direction toward the central region. The third micro L-type transmission line 173 is extended from the end of extension of the second microstrip-type transmission line 172 in the direction far away from the central region. The fourth micro L-type transmission line 174 is extended from the end of extension of the third micro L-type transmission line 173 in the direction toward the central region. The third micro L-type transmission line 173 comprises a fifth thin type transmission line 173a provided in the direction perpendicular to the second microstrip-type transmission line 172, and a sixth thin type transmission line 173b provided in the direction perpendicular to the fifth thin type transmission line 173a. The fourth micro L-type transmission line 174 comprises a seventh thin type transmission line 174a provided in the direction perpendicular to the sixth thin type transmission line 173b, and an eighth thin type transmission line 174b provided in the direction perpendicular to the seventh thin type transmission line 174a.

Figure 3:
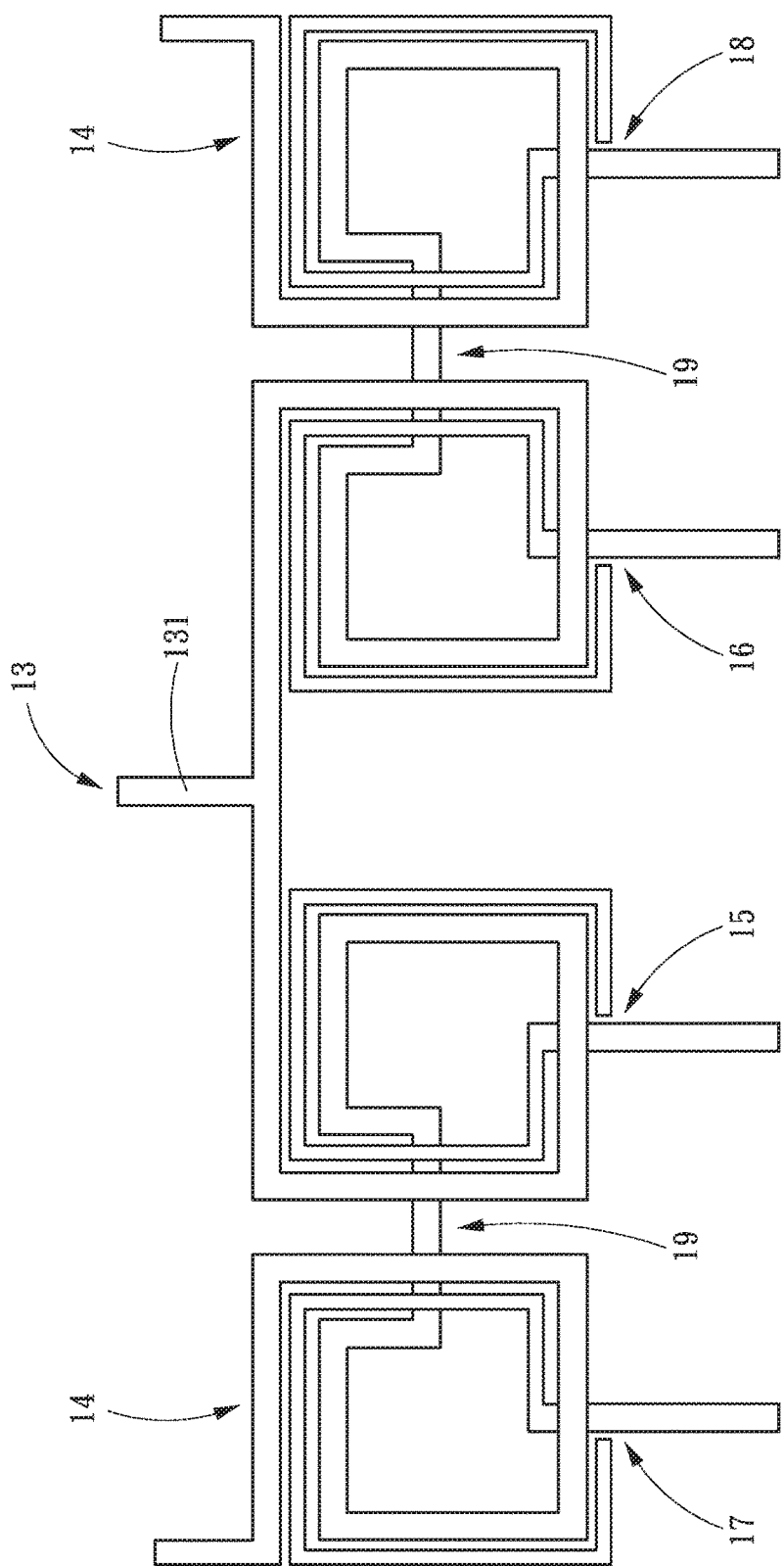
FIG. 3 is a structural diagram of the multi-balanced-unbalanced converting unit of the second embodiment of the present invention.
Figure 4A:
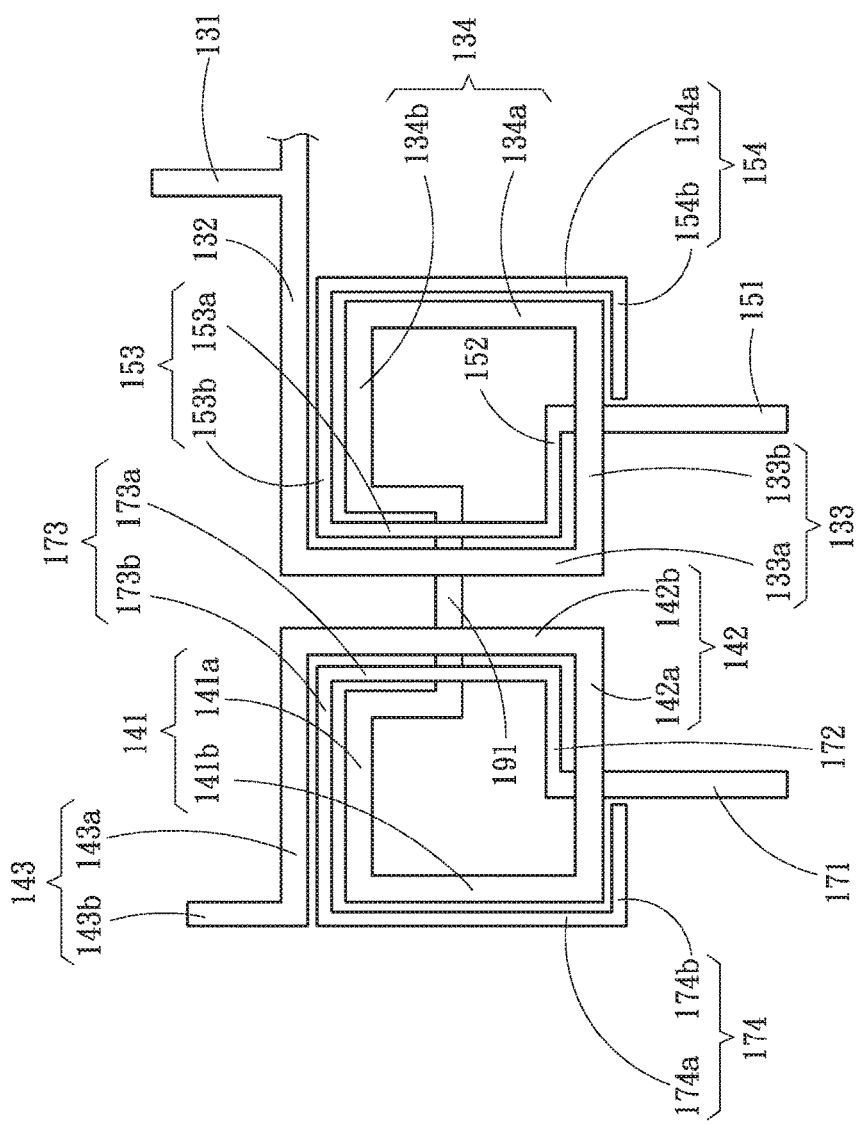
FIG. 4A is a partially enlarged diagram of left half of FIG. 3.
Figure 4B:
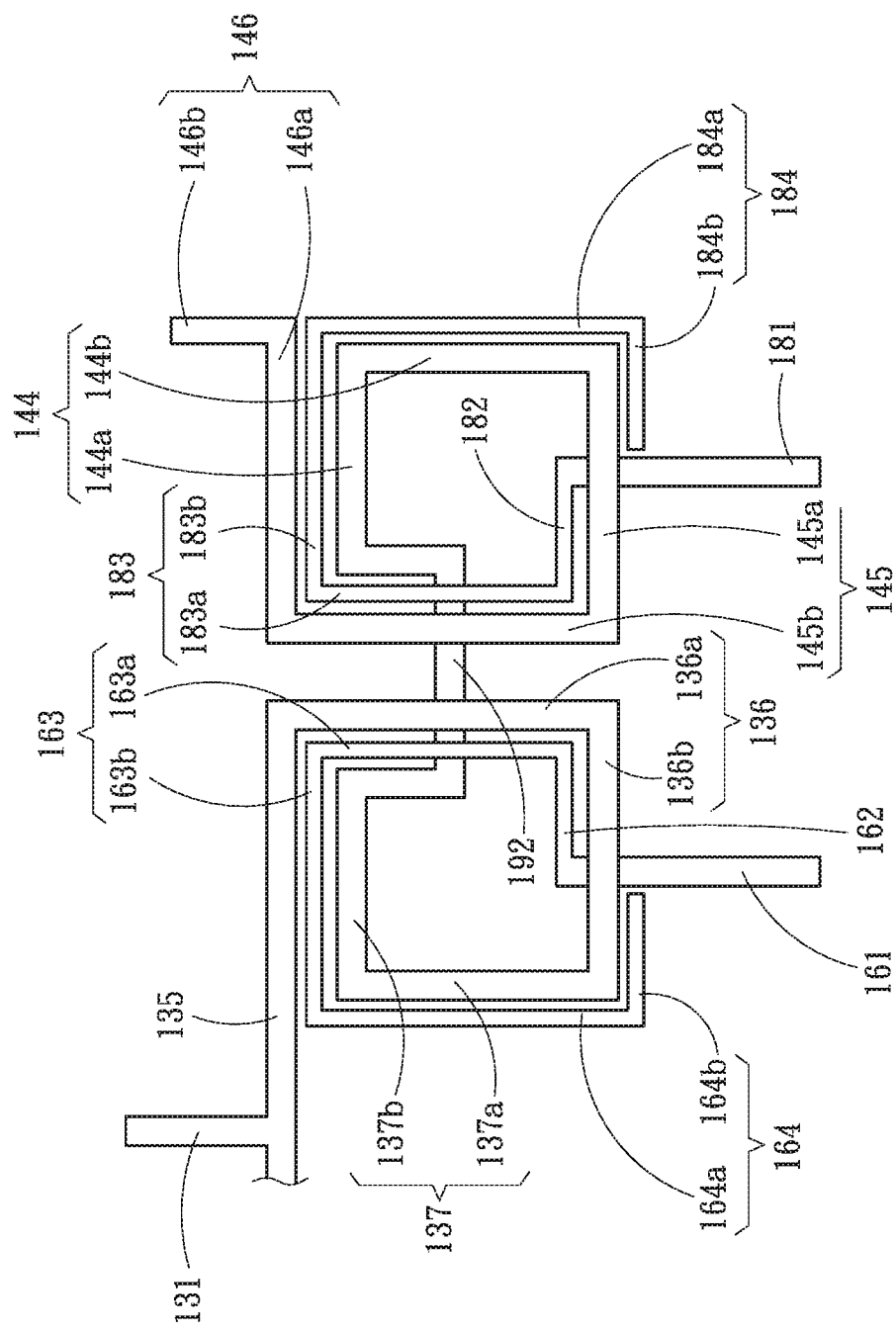
FIG. 4B is a partially enlarged diagram of right half of FIG. 3.

Further referring to FIG. 4B, which is a partially enlarged diagram of right half of FIG. 3, together, the first transmission line 13 comprises a sixth strip-type transmission line 135, a sixth L-type transmission line 136 and a seventh L-type transmission line 137. The sixth strip-type transmission line 135 is extended from one end of the first strip-type transmission line 131 in the direction far away from the central region. The sixth L-type transmission line 136 is extended from the end of extension of the sixth strip-type transmission line 135 in the direction far away from the central region. The seventh L-type transmission line 137 is extended from the end of extension of the sixth L-type transmission line 136 in the direction toward the central region. The sixth L-type transmission line 136 comprises an eleventh wide type transmission line 136a provided in the direction perpendicular to the sixth strip-type transmission line 135, and a twelfth wide type transmission line 136b provided in the direction perpendicular to the eleventh wide type transmission line 136a. The seventh L-type transmission line 137 comprises a thirteenth wide type transmission line 137a provided in the direction perpendicular to the twelfth wide type transmission line 136b, and a fourteenth wide type transmission line 137b provided in the direction perpendicular to the thirteenth wide type transmission line 137a. The connecting part 19 comprises a seventh strip-type transmission line 192, the seventh strip-type transmission line 192 being laterally extended from the end of extension of the seventh L-type transmission line 137 in the direction far away from the central region.

The second transmission line 14 is provided adjacent to the first transmission line 13, and comprises an eighth L-type transmission line 144, a ninth L-type transmission line 145 and a tenth L-type transmission line 146. The eighth L-type transmission line 144 is extended from the end of extension of the seventh strip-type transmission line 192 in the direction far away from the central region. The ninth L-type transmission line 145 is extended from the end of extension of the eighth L-type transmission line 144 in the direction toward the central region. The tenth L-type transmission line 146 is extended from the end of extension of the ninth L-type transmission line 145 in the direction far away from the central region. The eighth L-type transmission line 144 comprises a fifteenth wide type transmission line 144a provided in the direction perpendicular to the first strip-type transmission line 131, and a sixteenth wide type transmission line 144b provided in the direction perpendicular to the fifteenth wide type transmission line 144a. The ninth L-type transmission line 145 comprises a seventeenth wide type transmission line 145a provided in the direction perpendicular to the sixteenth wide type transmission line 144b, and an eighteenth wide type transmission line 145b provided in the direction perpendicular to the seventeenth wide type transmission line 145a. The tenth L-type transmission line 146 comprises a nineteenth wide type transmission line 146a provided in the direction perpendicular to the eighteenth wide type transmission line 145b, and a twentieth wide type transmission line 146b provided in the direction perpendicular to the nineteenth wide type transmission line 146a. The twentieth wide type transmission line 146b is extended in the direction far away from the eighth L-type transmission line 144.

The fourth transmission line 16 is provided adjacent to the first transmission line 13, and comprises an eighth strip-type transmission line 161, a third microstrip-type transmission line 162, a fifth micro L-type transmission line 163 and a sixth micro L-type transmission line 164. The eighth strip-type transmission line 161 is provided at one side of the twelfth wide type transmission line 136b of the sixth L-type transmission line 136. The third microstrip-type transmission line 162 is extended from one end of the eighth strip-type transmission line 161 in the direction far away from the central region. The fifth micro L-type transmission line 163 is extended from the end of extension of the third microstrip-type transmission line 162 in the direction toward the central region. The sixth micro L-type transmission line 164 is extended from the end of extension of the fifth micro L-type transmission line 163 in the direction far away from the central region. The fifth micro L-type transmission line 163 comprises a ninth thin type transmission line 163a provided in the direction perpendicular to the third microstrip-type transmission line 162, and a tenth thin type transmission line 163b provided in the direction perpendicular to the ninth thin type transmission line 163a. The sixth micro L-type transmission line 164 comprises an eleventh thin type transmission line 164a provided in the direction perpendicular to the tenth thin type transmission line 163b, and a twelfth thin type transmission line 164b provided in the direction perpendicular to the eleventh thin type transmission line 164a.

The sixth transmission line 18 is provided adjacent to the second transmission line 14, and comprises a ninth strip-type transmission line 181, a fourth microstrip-type transmission line 182, a seventh micro L-type transmission line 183 and an eighth micro L-type transmission line 184. The ninth strip-type transmission line 181 is provided at one side of the seventeenth wide type transmission line 145a of the ninth L-type transmission line 145. The fourth microstrip-type transmission line 182 is extended from one end of the ninth strip-type transmission line 181 in the direction toward the central region. The seventh micro L-type transmission line 183 is extended from the end of extension of the fourth microstrip-type transmission line 182 in the direction far away from the central region. The eighth micro L-type transmission line 184 is extended from the end of extension of the seventh micro L-type transmission line 183 in the direction toward the central region. The seventh micro L-type transmission line 183 comprises a thirteenth thin type transmission line 183a provided in the direction perpendicular to the fourth microstrip-type transmission line 182, and a fourteenth thin type transmission line 183b provided in the direction perpendicular to the thirteenth thin type transmission line 183a. The eighth micro L-type transmission line 184 comprises a fifteenth thin type transmission line 184a provided in the direction perpendicular to the fourteenth thin type transmission line 183b, and a sixteenth thin type transmission line 184b provided in the direction perpendicular to the fifteenth thin type transmission line 184a. In the present invention, the first strip-type transmission line 131, the fourth strip-type transmission line 151, the eighth strip-type transmission line 161, the fifth strip-type transmission line 171 and the ninth strip-type transmission line 181 are electrically connected to the first transmission end 111, the second transmission end 121, the third transmission end 122, the fourth transmission end 123 and the fifth transmission end 124, respectively.

Figure 5:
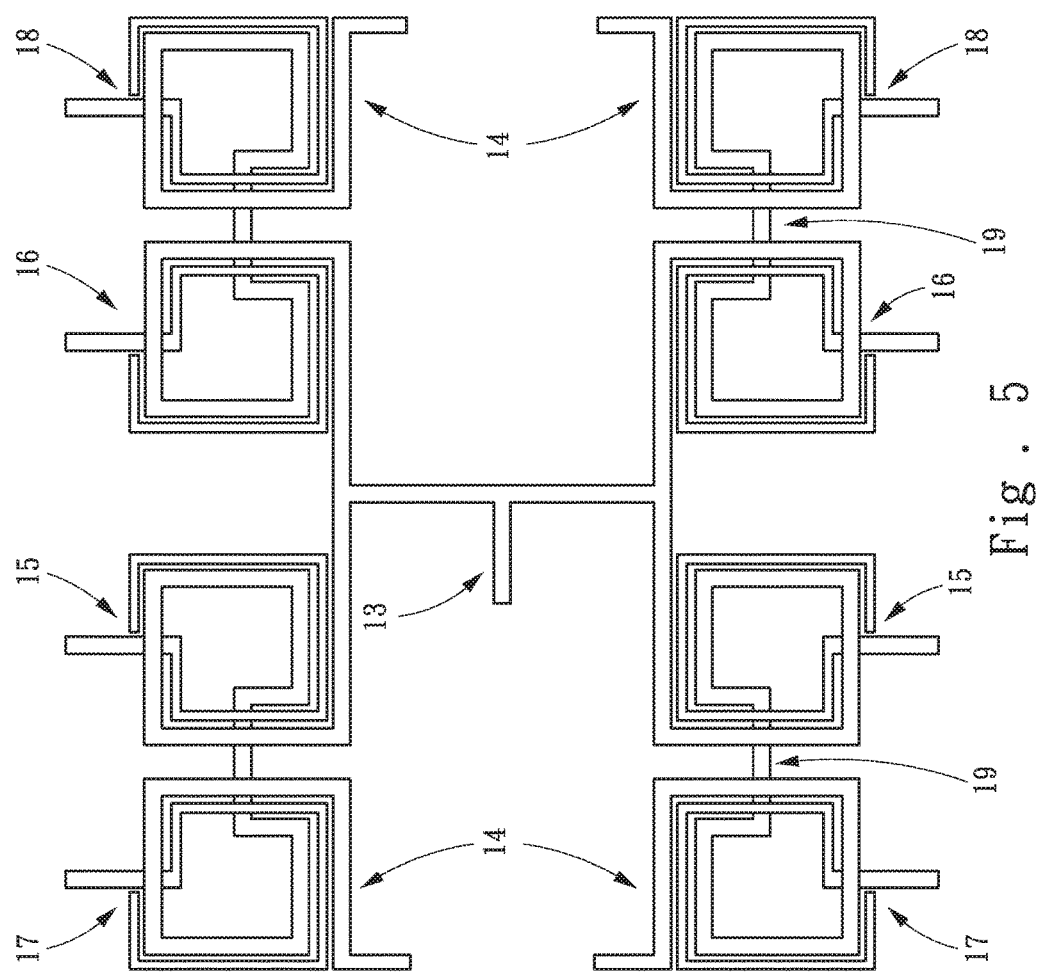
FIG. 5 is a structural diagram of a multi-balanced-unbalanced converting unit of a third embodiment of the present invention.

Referring to FIG. 5, there is shown a structural diagram of a multi-balanced-unbalanced converting unit of a third embodiment of the present invention. For widening the application of the multi-balanced-unbalanced converting unit 10 further, the structure of the multi-balanced-unbalanced converting unit of the previous embodiment is symmetrically mapped in the present embodiment, such that the second input/output ends 12, originally provided with only four transmission ends, are formed with eight transmission ends. In this way, more saturated output power than that in the previous embodiment may be obtained. The characteristics of the transmission lines are similar to those in the previous embodiment, and should not be described further.

In the practical operation, taking FIG. 1 for example, an input power signal P1 is inputted to the multi-balanced-unbalanced converting unit 10 from the first transmission end 111 to be subject to balanced-unbalanced signal conversion, and then outputted from the second transmission end 121, the third transmission end 122, the fourth transmission end 123 and the fifth transmission end 124, respectively, as a first signal P2 with power reduced by four times while at phase angle of 180 degrees, a second signal P3 with power reduced by four times while at phase angle of 180 degrees, a third signal P4 with power reduced by four times while at phase angle of 0 degrees and a fourth signal P5 with power reduced by four times while at phase angle of 0 degrees. These signals are gained by G times with unchanged phase angle by the power amplifying units 20. The gained first signal P2G and second signal P3G are inputted to the upper dual-path power combining unit 30 and then combined as a fifth signal P6 with power increased to two times as compared with the first signal P2G or the second signal P3G while still at phase angle of 180 degrees, as well as the gained third signal P4G and fourth signal P5G are inputted to the lower dual-path power combining unit 30 and then combined as a sixth signal P7 being two times as compared with the third signal P4G or the fourth signal P5G while still at phase angle of 0 degrees. Finally, the fifth signal P6 and the sixth signal P7 are inputted to the differential power combining unit 40 and then combined as a seventh signal P8 being two times as compared with the fifth signal P6 or the sixth signal P7 while still at phase angle of 0 degrees. In this case, the seventh signal P8 is gained to G times as compared with the input power signal P1.

Figure 6:
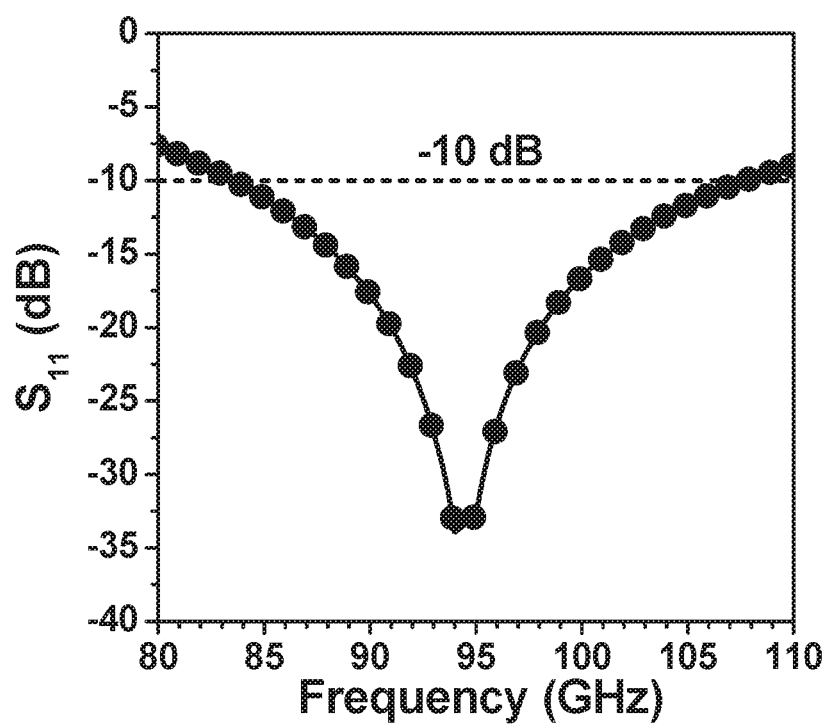
FIG. 6 is a graph of simulation result for return loss of one embodiment of the present invention.
Figure 7A:
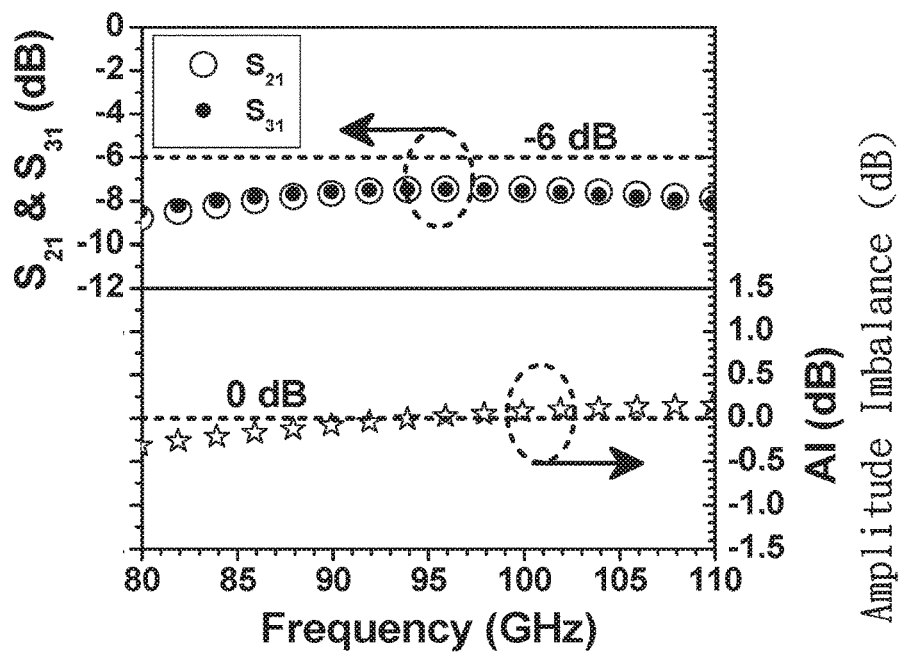
FIG. 7A is a graph of simulation result for feed loss and amplitude imbalance of one embodiment of the present invention.
Figure 7B:
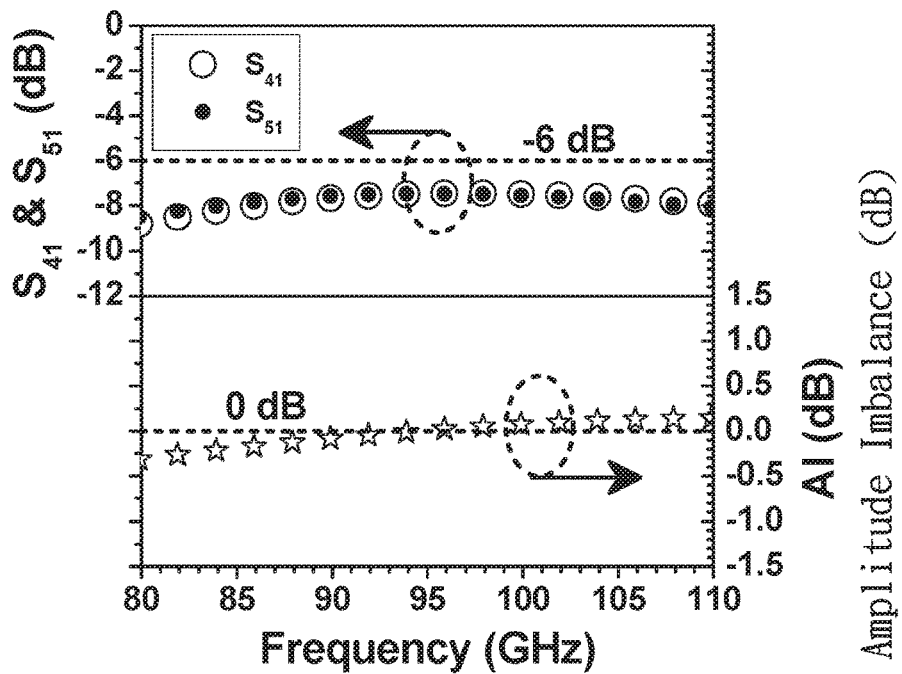
FIG. 7B is a graph of simulation result for feed loss and amplitude imbalance of one embodiment of the present invention.
Figure 8A:
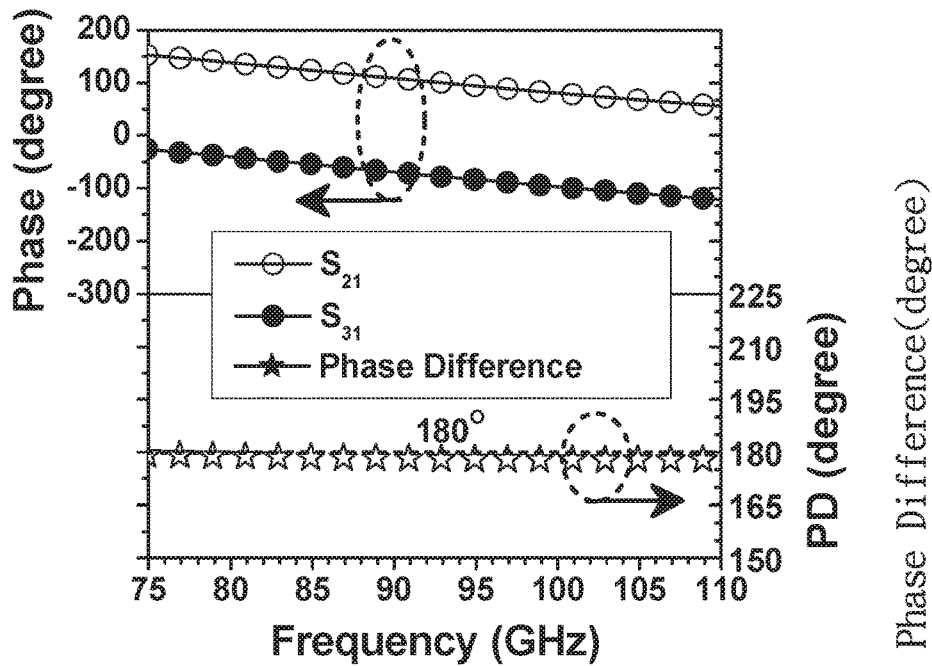
FIG. 8A is a graph of simulation result for phase difference of one embodiment of the present invention.
Figure 8B:
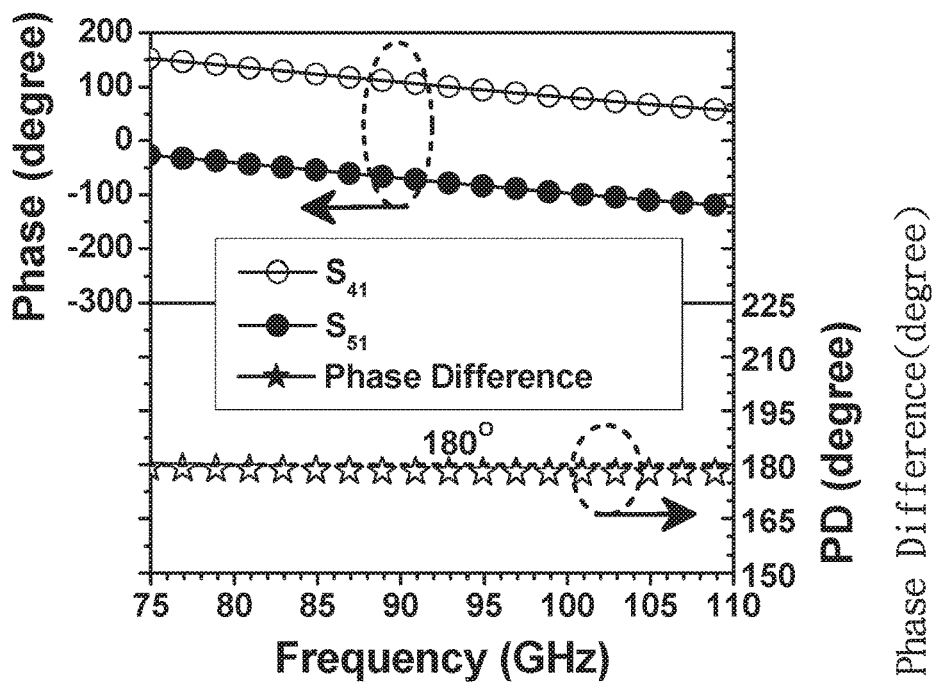
FIG. 8B is a graph of simulation result for phase difference of one embodiment of the present invention.

Signal simulation is performed with respect to the multi-balanced-unbalanced converting unit 10 for the verification of superior transmission efficiency remained for the multi-balanced-unbalanced converting unit 10 proposed in the present invention when 1/12 wavelength transmission lines are used instead of 1/4 wavelength or 1/2 wavelength transmission lines. Referring to FIG. 6, measurement of S-parameter is performed with respect to the multi-balanced-unbalanced four-path converting unit of the aforementioned second embodiment. It is known from the result of simulation that return loss S11 is less than −10 dB, i.e., reflected power is lower than one-tenth of input power, in the range of frequency between 83.5 GHz and 107.8 GHz. This result represents that better S11 performance is provided in the aforementioned range of frequency. Further referring to FIGS. 7A and 7B, each of feed loss S21, S31, S41 and S51 is close to an ideal value of −6 dB in the range of frequency between 80 GHz and 110 GHz, and additionally, amplitude imbalance is extremely close to an ideal value of 0 dB in the range of frequency between 80 GHz and 110 GHz. This result represents that power inputted from the first transmission end 111 will be divided into four parts, which are then transmitted to the second transmission end 121, the third transmission end 122, the fourth transmission end 123 and the fifth transmission end 124, respectively. Further referring to FIGS. 8A and 8B, phase difference between feed loss S21 and feed loss S31, as well as phase difference between feed loss S41 and feed loss S51 are both located in the vicinity of 180 degrees. This result represents that better equidivision of differential signal power may be obtained. In this case, the aforementioned return loss S11 is measured at the first transmission end 111, while feed loss S21, S31, S41 and S51 are measured between the first transmission end 111 and the second transmission end 121, the third transmission end 122, the fourth transmission end 123 and the fifth transmission end 124, respectively.

To sum up, the multi-balanced-unbalanced converting unit is made up of ¹⁄₁₂ wavelength transmission lines, each of which is one-third as long as the conventional ¼ wavelength transmission line, such that the overall area of circuit is reduced significantly. Moreover, shorter transmission lines are required, so as to achieve lower transmission loss, and further, enhanced overall characteristics. In addition, multi-balanced-unbalanced conversion may be adopted due to increased available space, in such a way that maximum power output is obtained.

The present invention has been described above in detail. The forgoing, however, are only preferred embodiments of the present invention, and should not be used for limiting the scope of the present invention. That is to say, equivalent variations and modifications made in accordance with claims of the present invention should fall within the scope covered by the present invention.

What is claimed is:

1. A power amplifying converter, comprising:
    a multi-balanced-unbalanced converting unit, provided with a first input/output end and a plurality of second input/output ends;
    a plurality of power amplifying units, each of which is provided with a first input end and a first output end, respectively, said first input end of each of said plurality of power amplifying units being electrically connected to one of said plurality second input/output ends;
    a plurality of dual-path power combining units, each of which is provided with two second input ends and a second output end, said second input end being electrically connected to said first output end; and
    a differential power combining unit, provided with two third input ends and a third output end, said third input end being electrically connected to said second output end,
    wherein said multi-balanced-unbalanced converting unit is made up of a plurality of ¹⁄₁₂ wavelength transmission lines.

2. The power amplifying converter according to claim 1, wherein said first input/output end further comprises a first transmission end, while said second input/output end further comprises a second transmission end, a third transmission end, a fourth transmission end and a fifth transmission end.

3. The power amplifying converter according to claim 2, wherein said multi-balanced-unbalanced converting unit comprises a first transmission line, a second transmission line, a third transmission line, a fourth transmission line, a fifth transmission line and a sixth transmission line, said first transmission line and said second transmission line being provided adjacent to each other, said first transmission line being electrically connected at one end thereof to said first transmission end, said first transmission line being electrically connected at the other end thereof to one end of said second transmission line, said second transmission line being electrically connected at the other end thereof to one grounding end, said third transmission line and said fourth transmission line being horizontally provided at the top and bottom sides of said first transmission line, respectively, said third transmission line being electrically connected at two ends thereof to said second transmission end and said grounding end, respectively, said fourth transmission line being electrically connected at two ends thereof to said third transmission end and said grounding end, respectively, said fifth transmission line and said sixth transmission line being horizontally provided at top and bottom sides of said second transmission line, respectively, said fifth transmission line being electrically connected at two ends thereof to said fourth transmission end and said grounding end, respectively, said sixth transmission line being electrically connected at two ends thereof to said fifth transmission end and said grounding end, respectively.

4. The power amplifying converter according to claim 2, wherein said multi-balanced-unbalanced converting unit comprises a first transmission line, a second transmission line, a third transmission line, a fourth transmission line, a fifth transmission line and a sixth transmission line, said second transmission line comprising a first branch transmission line, a second branch transmission line, a third branch transmission line and a fourth branch transmission line, said first transmission line being electrically connected at one end thereof to said first transmission end, said first transmission line being electrically connected at the other end thereof to one end of said first branch transmission line and one end of said second branch transmission line, the other end of said first branch transmission line and the other end of said second branch transmission line being electrically connected to one end of said third branch transmission line and one end of said fourth branch transmission line, respectively, the other end of said third branch transmission line and the other end of said fourth branch transmission line being electrically connected to a grounding end, respectively, said third transmission line, said fourth transmission line, said fifth transmission line and said sixth transmission line being provided horizontally with respect to said first branch transmission line, said second branch transmission line, said third branch transmission line and said fourth branch transmission line, said third transmission line being electrically connected at two ends thereof to said second transmission end and said grounding end, respectively, said fourth transmission line being electrically connected at two ends thereof to said third transmission end and said grounding end, respectively, said fifth transmission line being electrically connected at two ends thereof to said fourth transmission end and said grounding end, respectively, said sixth transmission line being electrically connected at two ends thereof to said fifth transmission end and said grounding end, respectively.

5. The power amplifying converter according to claim 3, wherein said first transmission line, said second transmission line, said third transmission line, said fourth transmission line, said fifth transmission line and said sixth transmission line are formed by coiling in a manner of planar spiral.

6. The power amplifying converter according to claim 4, wherein said first transmission line, said second transmission line, said third transmission line, said fourth transmission line, said fifth transmission line and said sixth transmission line are formed by coiling in a manner of planar spiral.

\* \* \* \* \*